(12) United States Patent
Kim et al.

(10) Patent No.: US 6,456,546 B2
(45) Date of Patent: Sep. 24, 2002

(54) REPAIR CIRCUIT USING ANTIFUSE

(75) Inventors: Phil-Jung Kim; Jae-Kyung Wee; Chang-Hyuk Lee; Young-Ho Seol; Jin-Keun Oh; Ho-Youb Cho, all of Ichon-shi (KR)

(73) Assignee: Hyundai Electronics Industries Co., LTD., Ichon-shi (KR)

( * ) Notice: Subject to any disclaimer, the term of this patent is extended or adjusted under 35 U.S.C. 154(b) by 0 days.

(21) Appl. No.: 09/737,845

(22) Filed: Dec. 18, 2000

(30) Foreign Application Priority Data

Dec. 29, 1999 (KR) ............................. 99-65007

(51) Int. Cl.[7] ............................................. G11C 7/00
(52) U.S. Cl. ..................................... 365/200; 365/225.7
(58) Field of Search ........................... 365/200, 189.05, 365/189.09, 189.11, 225.7, 194

(56) References Cited

U.S. PATENT DOCUMENTS 5,801,574 A * 9/1998 Martin et al. ............... 327/525
6,181,627 B1 * 1/2001 Casper et al. ............. 365/225.7
6,233,194 B1 * 5/2001 Marr et al. ............... 365/225.7

* cited by examiner

Primary Examiner—Richard Elms
Assistant Examiner—Hien Nguyen
(74) Attorney, Agent, or Firm—Finnegan, Henderson, Farabow, Garrett & Dunner, L.L.P.

(57) ABSTRACT

A repair circuit substitutes a defective cell with a redundancy cell. For the purpose, the repair circuit includes an antifuse programmed by a voltage difference of both ends thereof, a programming circuit for programming the antifuse, a detection circuit for detecting whether the antifuse is programmed or unprogrammed by using a first and a second power stabilization signal of a power up reset circuit, wherein the detection is performed during a power stabilization period or after the power stabilization period, a latch circuit for latching the result of the detection to thereby generate an output signal, and a redundancy circuit having a redundancy cell for repairing the defective cell in response to the output signal of the latch circuit.

10 Claims, 5 Drawing Sheets

REPAIR CIRCUIT USING ANTIFUSE

FIELD OF THE INVENTION

The present invention relates to a repair circuit of memory device; and, more particularly, to a circuit for detecting a programming state of an antifuse compensating a defective cell of the memory device by using a power stabilization signal or a signal for operating the memory device.

DESCRIPTION OF THE PRIOR ART

A semiconductor integrated circuit (IC) includes much more circuit devices in a given silicon region as an IC technique has developed. There are needed much more circuit devices so as to reduce or clear defects of these circuit devices. For achieving the higher integration by maximizing the die-availability, a circuit designer tries to reduce the size of an individual circuit device. However, the size reduction may cause the circuit device to be even more affected by a defect resulted from impurities intruded during a manufacturing process. The defect should be checked during a testing procedure after the manufacturing process of ICs, or verified after a semiconductor chip level or package is completed. When the defect, particularly a factual defect exists in a few circuit devices of the ICs, it is economically undesirable to discard the ICs having the defect.

In the manufacturing of ICs, it is impractical to expect a zero defect. Therefore, redundancy circuits are provided to ICs in order to reduce the number of discarded ICs. For instance, if a first device is determined as a defective device, then a redundancy circuit substitutes the defective device. The practical reduction of the number of discarded ICs can be achieved by using the redundancy circuits without increasing the practical cost of IC devices.

There are IC devices such as DRAM, SRAM, VRAM and EPROM, which use the redundancy circuits. A typical IC memory circuit includes a plurality of memories, which are arranged on addressable column and row arrays. The memory arranged on the column and row arrays is the first circuit device of the IC memory circuit. A redundancy circuit can substitute each bit having a defect.

Because the first device of an individual IC memory circuit is differently addressable, in order to repair the defective device, there needs a fuse blowing or an antifuse of a fuse control programmable circuit for programming the redundancy circuit according to an address of the first device. Such process is very effective in permanently substituting the defective device.

For example, in case of a DRAM, a certain memory cell can be selected by a column and row address therefor. A redundancy circuit has to recognize the available first memory circuit device and all signals have to be changed to ones suitable for the redundancy circuit when the addresses for the first memory circuit with the defect is inputted by a user. Therefore, a multiplicity of fuses or antifuses is related to each redundancy circuit. An allowable combination of blown or unblown fuses corresponding to each redundancy circuit represents a single address of all of the first devices replaced by the corresponding redundancy circuit.

An antifuse is a device acting as a switch for connecting two electrodes of an electrode, insulator and electrode structure by using a breakdown. A breakdown voltage of the insulator is called to a program-motive (PGM) voltage of the antifuse, wherein the two electrodes are unblown by programming the antifuse.

SUMMARY OF THE INVENTION

It is, therefore, an object of the present invention to provide a repair circuit for programming a signal for compensating a defective cell of a memory device by using an antifuse, and detecting whether the antifuse is programmed or not by using a power stabilization signal.

In accordance with the present invention, there is provided a repair circuit for repairing a defective cell, which comprises: an antifuse programmed by a voltage difference of both ends thereof; a programming circuit for programming the antifuse; a detection circuit for detecting whether the antifuse is programmed or not by using a first and a second power stabilization signal of a power up reset circuit, wherein the detection is performed during a power stabilization period or after the power stabilization period; a latch circuit for latching the result of the detection to thereby generate an output signal; and a redundancy circuit having a redundancy cell for repairing the defective cell in response to the output signal of the latch circuit.

BRIEF DESCRIPTION OF THE DRAWINGS

The objects and features of the present invention will become apparent from the following description of preferred embodiments given in conjunction with the accompanying drawings, in which.

DETAILED DESCRIPTION OF THE PREFERRED EMBODIMENTS

Figure 1:
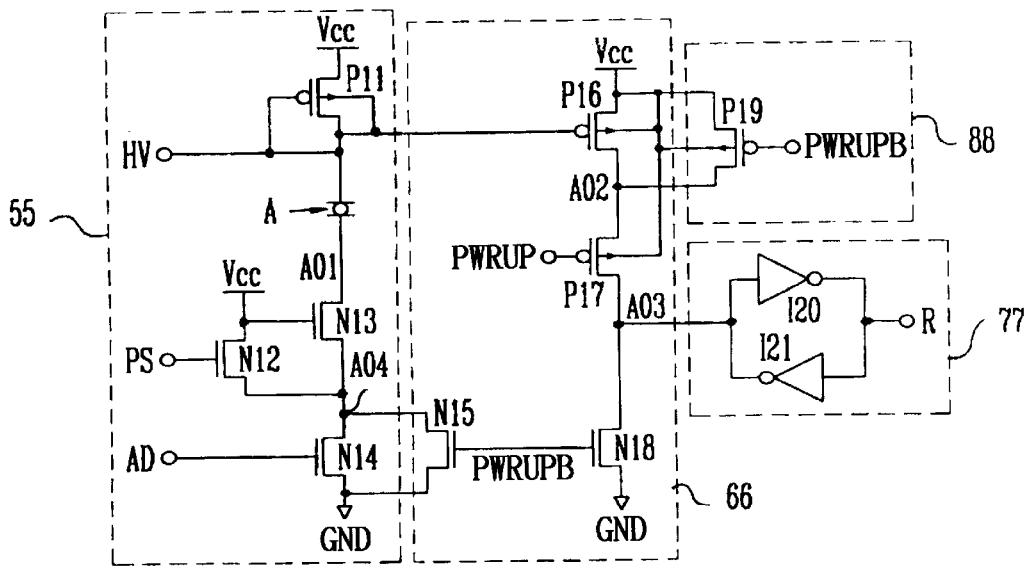
FIG. 1 shows a schematic diagram of an antifuse circuit in accordance with a first embodiment of the present invention.

Referring to FIG. 1, there is shown a schematic diagram of an antifuse circuit in accordance with a first embodiment of the present invention. The antifuse circuit comprises a programming circuit 55 for programming the antifuse, a detection circuit 66 for detecting whether the antifuse is programmed or not, a latch circuit 77 for latching the result of the detection, and a power supplying circuit 88 for supplying a power voltage after the power is stabilized.

Hereinafter, the operation of the above antifuse circuit will be explained in detail by each step.

INITIALIZATION

In the programming circuit 55 shown in FIG. 1, a PMOS transistor P11 is used to detect whether the antifuse A is programmed or not by precharging a high voltage (HV) node with a constant voltage when the HV node has a floating state. NMOS transistors N12 and N13 are used to input the constant voltage to a first node A01 by being provided with a precharge signal PS before the antifuse A is programmed, and make the antifuse A not programmed by reducing a voltage difference of both ends of the antifuse A although the HV is inputted one end of the antifuse A. When a selection address AD for programming the antifuse A is inputted to its gate, an NMOS transistor N14 drops the voltage level of the first node A01 by 0V to thereby program the antifuse A by raising the voltage difference of both ends of the antifuse A.

Since the HV node is in a floating state during the power stabilization period, the PMOS transistor P11 is turned on so that a PMOS transistor P16 of the detection circuit 66 is turned off.

Meanwhile, during the power stabilization period, since a first control signal PWRUP has a logic low state and a second control signal PWRUPB has a logic high state, an NMOS transistor N18 is turned on. Therefore, a third node A03 becomes to have a logic low state.

Then, the logic low signal of the third node A03 is inputted to the latch circuit 77 which, in turn, generates an output R having a logic high state, wherein the latch circuit 77 includes two inverters I20 and I21.

If the precharge signal PS has a logic high state, the NMOS transistors N12 and N13 are turned on so that the first and fourth nodes A01 and A04 become to have a Vcc voltage. This Vcc voltage provided to the first node A01 can prevent the antifuse A from being programmed by reducing the voltage difference of both ends of the antifuse A although a high voltage for programming the antifuse A is inputted to one end of the antifuse A during the power stabilization period. Further, during the power stabilization period, the selection address AD maintains a logic low state.

PROGRAMMING OPERATION

If the selection address AD has a logic high state after the power stabilization, the NMOS transistor N14 is turned on and then the voltage difference between the first and the fourth nodes A01 and A04 is delivered to the other end of the antifuse A. At this time, if a programming voltage, e.g., higher than 7V, of the HV node is delivered to the other end of the antifuse, the antifuse A is programmed by the voltage difference of both ends of the antifuse A.

DETECTING AND LATCHING OPERATION

At the detection circuit 66 in FIG. 1, the PMOS transistor P16 is turned on or off by the voltage coupled to the antifuse A.

The first control signal PWRUP inputted into a PMOS transistor P17 has a logic low state only during the power stabilization period and it has a logic high state in the remaining time. An NMOS transistor N15 is used to make a current path between the antifuse A and ground GND.

The second control signal PWRUPB inputted into the NMOS transistors N15 and N18 maintains a voltage equal to the power voltage only during the power stabilization period and it has a logic low state in the remaining time. The detecting and latching operation is performed by the operation of the above transistors as follows.

After all antifuses were programmed, the power stabilization is carried out for a given period when the power is turned on after it was turned off. During the second power stabilization period, it is detected whether the antifuse A is programmed or unprogrammed.

The HV node has the floating state during the power stabilization period and, therefore, a voltage Vcc−Vt is inputted to the HV node through the PMOS transistor P11.

If the antifuse A is programmed, the voltage of the HV node becomes to have a lower level since there occurs a current path through the NMOS transistors N13 and N15.

Figure 3:
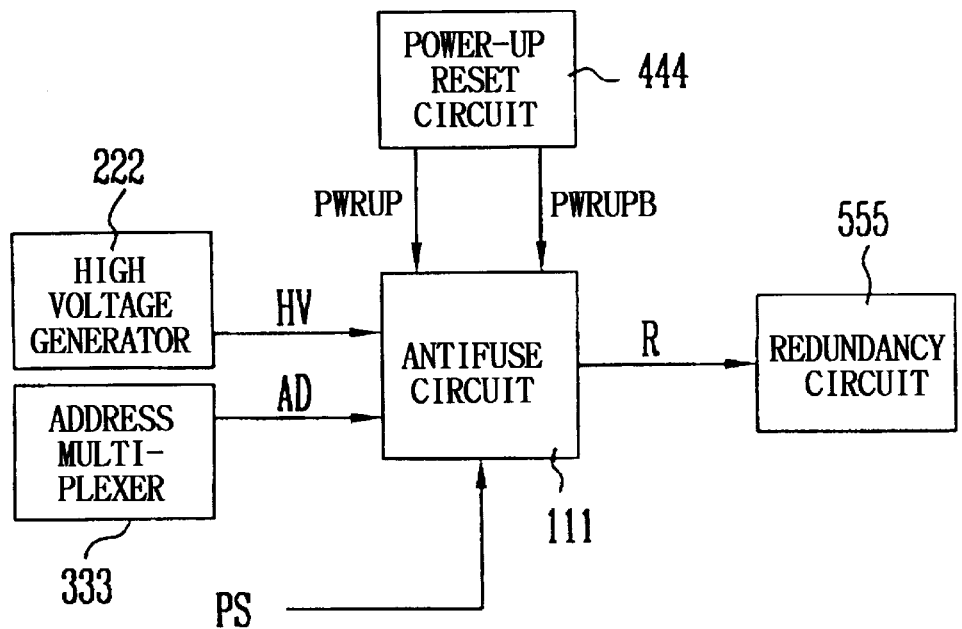
FIG. 3 represents a block diagram of a repair circuit in accordance with the present invention.

During the second power stabilization period, the first control signal PWRUP generated from a power up reset circuit 444 in FIG. 3 has 0V and the second control signal PWRUPB has the Vcc voltage.

In the detection circuit 66, since the PMOS transistors P16 and P17 are turned on by the low voltage of the HV node and the first control signal PWRUP which has a logic low state, which are coupled to the gates of the PMOS transistors P16 and P17, respectively, the Vcc voltage is provided to the third node A03 through the PMOS transistors P16 and P17. Then, the Vcc voltage is inputted to the inverter I20 of the latch circuit 77 and, thereafter, the output R is generated to have a logic low state.

On the other hand, if the antifuse A is unprogrammed, since the current path through the antifuse A is not made, a high voltage of the HV node is coupled to the gate of the PMOS transistor P16 which is, in turn, turned off.

At this time, since the PMOS transistor P19 is turned off by the second control signal PWRUPB having a logic high state, few of currents are delivered into the third node A03. Although there is current provision to the third node A03, since the delivered currents are leaked to the ground GND through the NMOS transistor N18, the voltage level of the third node A03 becomes low. Therefore, the output R of the latch circuit 77 becomes to have a logic high state.

The power supplying circuit 88 in FIG. 1 is used to input the power voltage Vcc to the second node A02 after the power stabilization. Further, the power supplying circuit 88 is employed to reduce a voltage difference between a gate and a junction by inputting the Vcc into the junction of the PMOS transistor P16, to thereby prevent a gate-junction breakdown from being occurred at the PMOS transistor P16 when the HV is inputted into the gate of the PMOS transistor P16 during the programming of the antifuse A.

Figure 2:
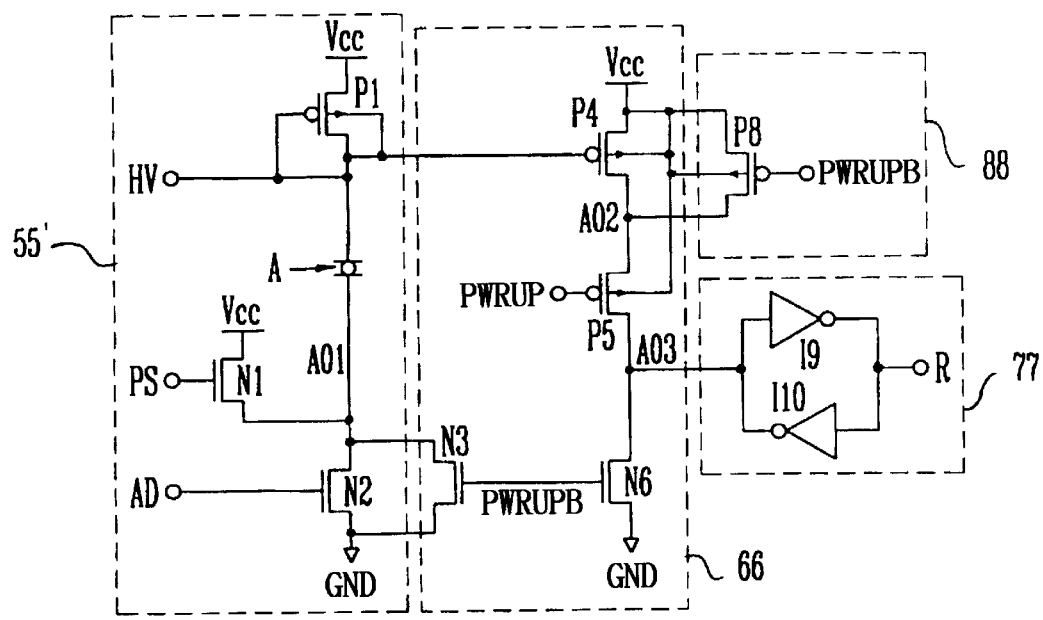
FIG. 2 depicts a schematic diagram of an antifuse circuit in accordance with a second embodiment of the present invention.

Referring to FIG. 2, there is a schematic diagram of an antifuse circuit in accordance with a second embodiment of the present invention. An operation of the antifuse circuit in FIG. 2 is almost identical to that of the antifuse circuit shown in FIG. 1.

In a programming circuit 55", an NMOS transistor N1 is directly connected to the power voltage node Vcc so as to provide a constant voltage into a first node A01. Also, each junction of NMOS transistors N1, N2 and N3 of the programming circuit 55' and a detection circuit 66 has an n-type, and so the stabilization of the HV is realized by raising a junction-to-gate breakdown voltage.

Referring to FIG. 3, there is a block diagram of a repair circuit in accordance with the present invention, which is a peripheral circuit used to operate the circuit shown in FIG. 1 or 2.

The repair circuit includes an antifuse circuit 111, a high voltage generator 222 for generating the HV to be used in programming an antifuse, an address multiplexer 333 for outputting the address AD to be used in selecting the antifuse to be programmed, a power-up reset circuit 444 for outputting the first and the second control signals PWRUP and PWRUPB by detecting the power stabilization state, and a redundancy circuit 555 for substituting a defective cell with a redundancy cell by using the output R of the antifuse circuit 111, wherein the precharge signal PS is provided to the antifuse circuit 111 to thereby provide a constant voltage into one end of the antifuse so that the antifuse can be programmed only during the power stabilization period.

Figure 4:
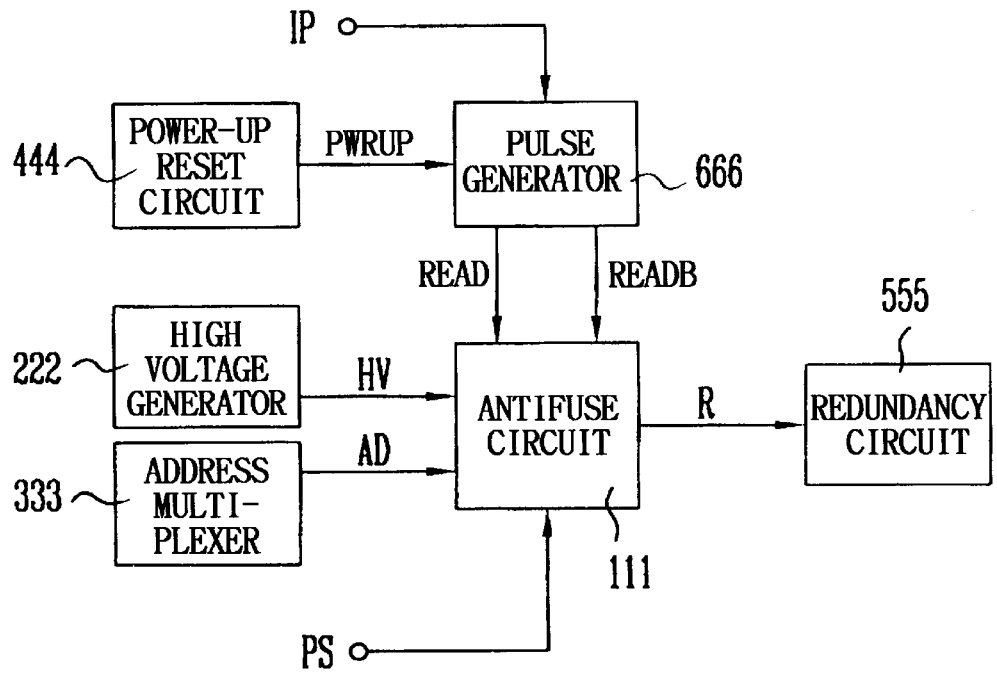
FIG. 4 is a block diagram of another repair circuit in accordance with the present invention.

Referring to FIG. 4, there is a block diagram of another repair circuit, which further includes a pulse generator 666 for generating a short pulse, wherein the pulse signal is used to detect whether the antifuse is programmed after the power stabilization. Herein, a chip select (CS) signal of a memory device or a row address strobe (RAS) signal is used as an input IP of the pulse generator 666.

Figure 5:
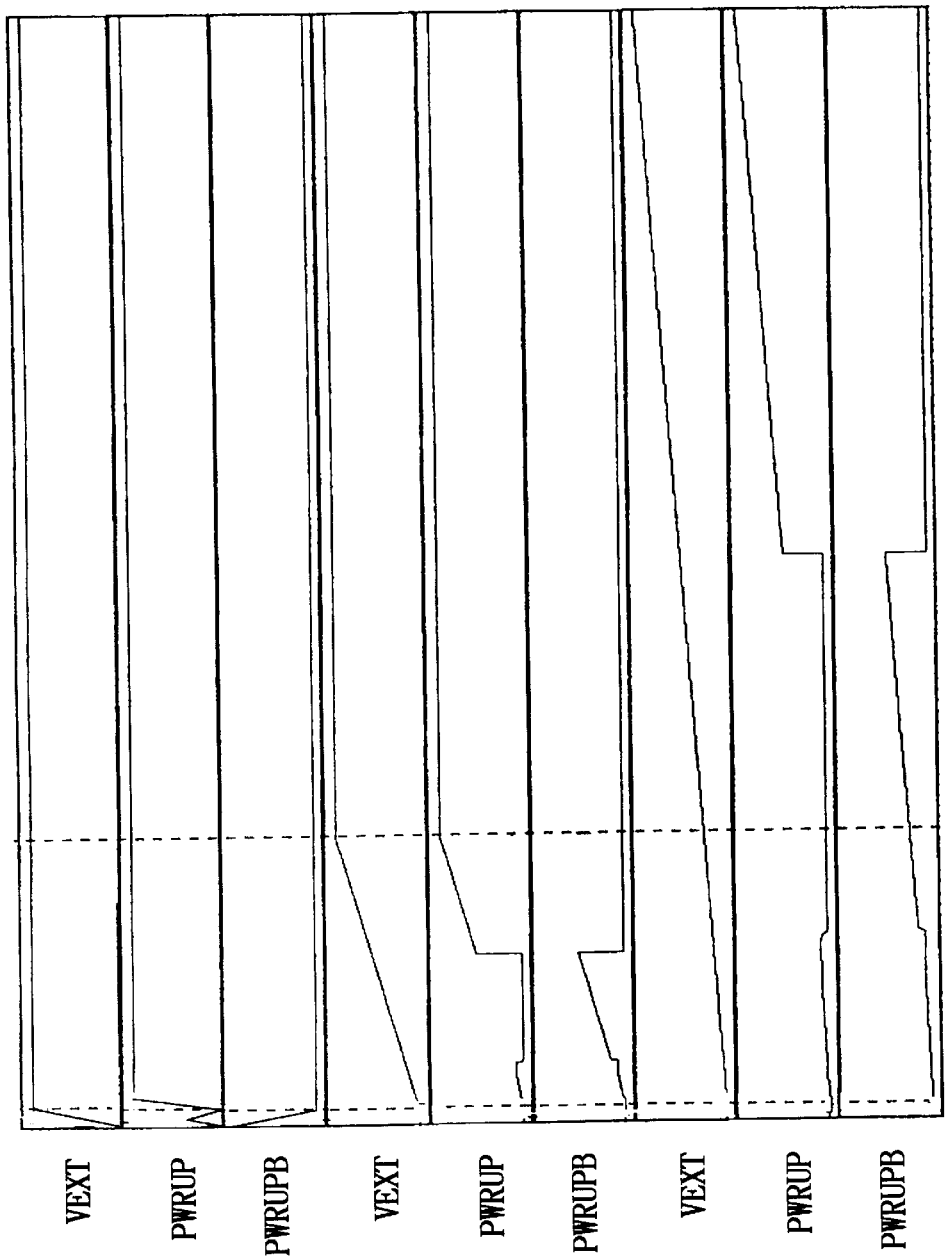
FIG. 5 illustrates a waveform diagram describing a simulation result of output signals during a power stabilization period of a power up reset circuit shown in FIG. 3.

Referring to FIG. 5, there is illustrated a simulation result of the power-up reset circuit 444 in FIG. 3.

As shown in FIG. 5, the first control signal PWRUP generated from the power-up reset circuit 444 maintains a logic low state during the power stabilization period and then it becomes a logic high state after the power stabilization is accomplished.

Figure 6:
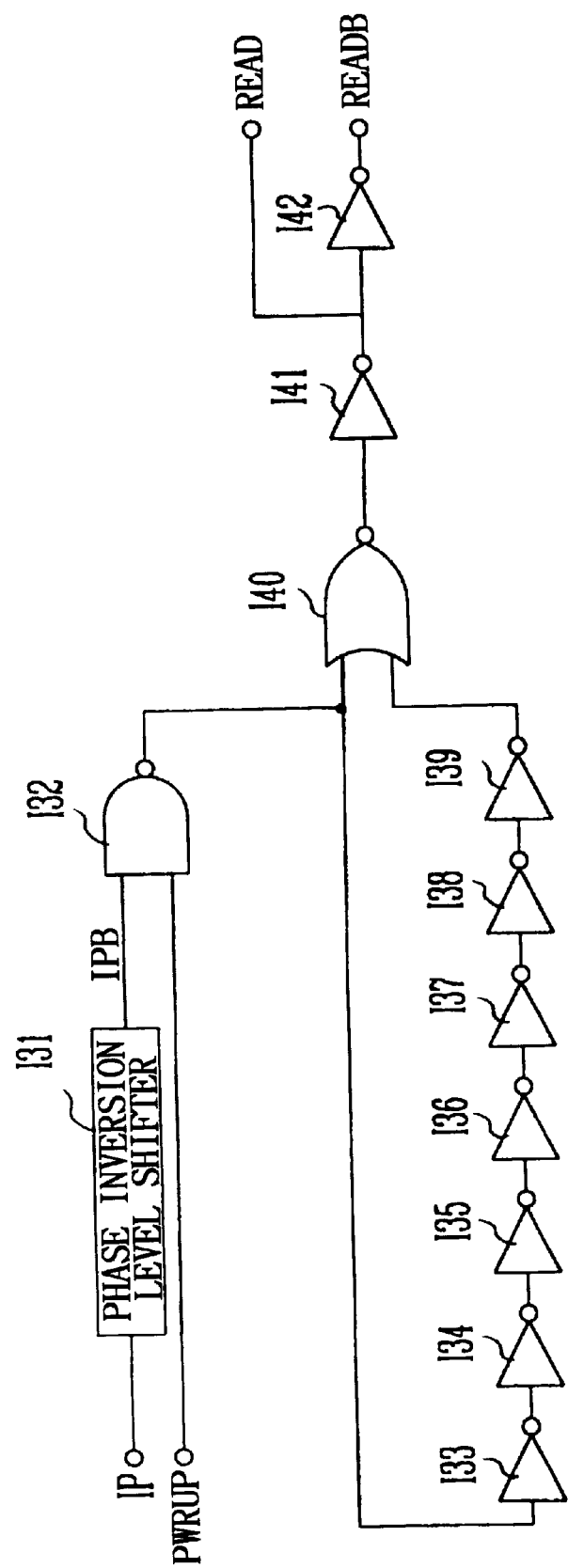
FIG. 6 describes a block diagram of a pulse generator shown in FIG. 4.

Referring to FIG. 6, there is described a detailed diagram of the pulse generator 666 in FIG. 4. The reset voltage of the outputs PWRUP and PWRUPB of the power-up reset circuit 444 are varied according to the power stabilization time, which causes a decreased detective margin at the detection circuit 66 of the antifuse circuit 111. In order to solve this problem, the pulse generator 666 that generates regular pulses, i.e., READ and READB, regardless of the power stabilization time is added to the repair circuit in FIG. 4. By further employing the pulse generator 666, the greater margin can be obtained when detecting whether the antifuse is programmed or unprogrammed.

If the first control signal PWRUP has a logic high state and a signal SCB (IP) is enabled by having a logic low state after the power stabilization, a signal CS (IPB) becomes to have a logic high state through a phase inversion level shifter I31 and an output of a NAND gate I32 becomes to have a logic low state. Since the output is delivered to a NOR gate I40 and then inverted by an inverter I41, one output READ having a logic low state is outputted through one output terminal and the other output READB having a logic high state is generated through the other output terminal.

Meanwhile, if a delayed output having a logic high state is provided to the other input of the NOR gate I40, the output signal READ is changed to a logic high state while the output signal READB is moved to a logic low state, wherein the delayed output is generated by serially connected inverters I33 to I39 based on the output of the NAND gate I32.

Figure 7:
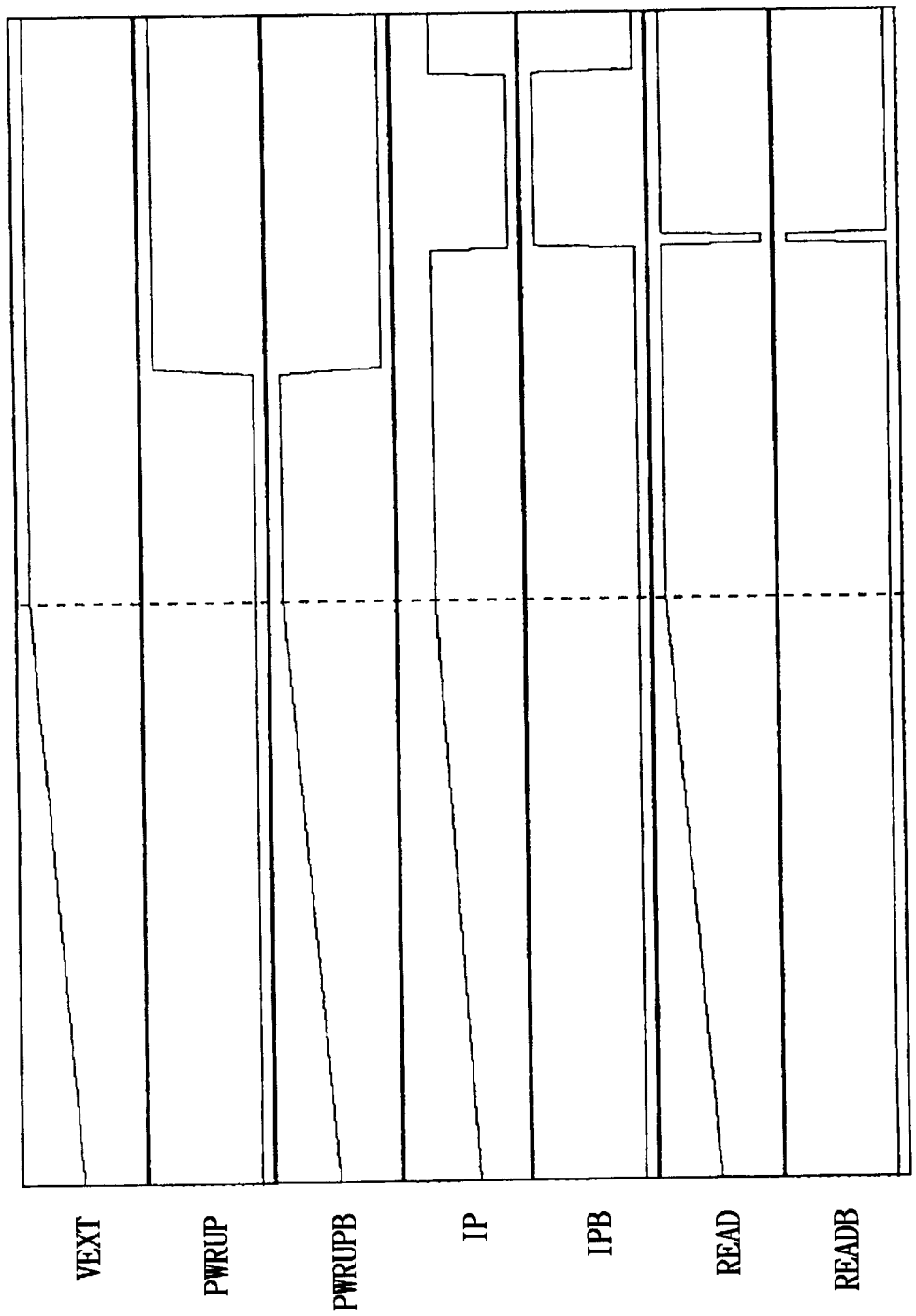
FIG. 7 is a waveform diagram of a simulation result for an input/output of the pulse generator shown in FIG. 6.

FIG. 7 represents a simulation result of the pulse generator shown in FIG. 6. As shown in FIG. 7, the output READ has a low pulse and the output READB has a high pulse.

As described above, by using a defective cell repair scheme based on antifuses, the present invention can detect whether the antifuse is programmed or unprogrammed during or after the power stabilization period and, as a result, the productivity of a memory device can be improved.

While the present invention has been described with respect to the particular embodiments, it will be apparent to those skilled in the art that various changes and modifications may be made without departing from the spirit and scope of the invention as defined in the following claims.

What is claimed is:

1. A repair circuit for substituting a defective cell with a redundancy cell, comprising:
   an antifuse programmed by a voltage difference of both ends thereof;
   a power-up reset circuit for generating a first and a second power stabilization signal;
   a programming circuit for programming the antifuse;
   a detection circuit for detecting whether the antifuse is programmed or unprogrammed by using the first and the second power stabilization signals, wherein the detection is performed during or after a power stabilization period; and
   a latch circuit for latching the result of the detection, wherein the defective cell is substituted with the redundancy cell in response to an output of the latch circuit.

2. The repair circuit as recited in claim 1, further comprising:
   a pulse generating means, connected between the power-up reset circuit and the detection circuit, for generating a first and a second short pulse in order to detect whether the antifuse is programmed or unprogrammed after the power stabilization period.

3. The repair circuit as recited in claim 2, wherein the pulse generating means produces the first and the second short pulses by using a first control signal and one of a chip select signal and a row address strobe signal.

4. The repair circuit as recited in claim 3, wherein the pulse generating means includes:
   a phase inversion level shifter receiving either the chip select signal or the row address strobe signal as its input;
   a NAND gate for combining an output of the phase inversion level shifter and the first control signal;
   a delay circuit for delaying and inverting an output of the NAND gate;
   a NOR gate for combining the outputs of the NAND gate and the delay circuit to generate the first short pulse; and
   an inverting gate for inverting an output of the NOR gate to generate the second short pulse.

5. The repair circuit as recited in claim 1, wherein the programming circuit includes:
   a first PMOS transistor, connected between a power voltage node and one end of the antifuse, whose gate is provided with a high voltage when the antifuse is programmed and is also connected to said one end of the antifuse;
   the antifuse connected between the first PMOS transistor and a first node;
   a first NMOS transistor, connected between the first node and a second node, whose gate is connected to the power voltage node;
   a second NMOS transistor, connected between the second node and ground, which gate is provided with an address for the programming; and
   a third NMOS transistor, connected between the power voltage node and the second node, whose gate is provided with a precharge signal.

6. The repair circuit as recited in claim 5, wherein one junction of each of the second and the third NMOS transistors has an N-type.

7. The repair circuit of claim 5, wherein the detection circuit includes:
   a second PMOS transistor, connected between the power voltage node and a third node, whose gate is connected to the gate of the first PMOS transistor;
   a third PMOS transistor, connected between the third node and a fourth node, whose gate is provided with the first control signal;
   a fourth NMOS transistor, connected between the fourth node and ground, whose gate is provided with the second control signal; and
   a fifth NMOS transistor, connected with the second NMOS transistor in parallel, whose gate is provided with the second control signal.

8. The repair circuit as recited in claim 7, wherein one junction of the fifth NMOS transistor has an N-type.

9. The repair circuit as recited in claim 7, wherein the detection circuit further includes:

a fourth PMOS transistor, connected with the second PMOS transistor in parallel in order to prevent a gate-to-junction breakdown of the second PMOS transistor, whose gate is provided with the second control signal.

10. The repair circuit as recited in claim 1, wherein the programming circuit includes:

a first PMOS transistor, connected between the power voltage node and one end of the antifuse, whose gate is provided with a high voltage when the antifuse is programmed and is also connected to said one end of the antifuse;

the antifuse connected between the first PMOS transistor and a first node;

a first NMOS transistor, connected between the first node and a second node, whose gate is provided with the power voltage node; and a third NMOS transistor, connected between the power voltage node and the second node, whose gate is provided with a precharge signal.

* * * * *